United States Patent
Moussy et al.

(10) Patent No.: US 11,901,395 B2
(45) Date of Patent: Feb. 13, 2024

(54) INSULATION STRUCTURE FORMING METHOD

(71) Applicant: Commissariat à l'Énergie Atomique et aux Énergies Alternatives, Paris (FR)

(72) Inventors: Norbert Moussy, Grenoble (FR); Cédric Giroud-Garampon, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 307 days.

(21) Appl. No.: 17/369,162

(22) Filed: Jul. 7, 2021

(65) Prior Publication Data
US 2022/0013574 A1    Jan. 13, 2022

(30) Foreign Application Priority Data

Jul. 10, 2020 (FR) .................................... 2007356

(51) Int. Cl.
*H01L 27/146* (2006.01)
(52) U.S. Cl.
CPC .... *H01L 27/14685* (2013.01); *H01L 27/1463* (2013.01)
(58) Field of Classification Search
CPC ........... H01L 27/14685; H01L 27/1463; H01L 27/146; H01L 27/14683; H01L 27/14687;
(Continued)

(56) References Cited

U.S. PATENT DOCUMENTS 5,283,201 A * 2/1994 Tsang ................. H01L 21/3065
257/E21.384
8,592,310 B2 * 11/2013 Park ................. H01L 21/76898
257/E23.024
(Continued)

FOREIGN PATENT DOCUMENTS

DE    10 2011 087 279 A1    6/2012
FR        3 059 464 A1    6/2018
(Continued)

OTHER PUBLICATIONS

Preliminary Search Report for French Application No. 2007356, dated Mar. 22, 2021.

*Primary Examiner* — Mounir S Amer
*Assistant Examiner* — Alexander Belousov
(74) *Attorney, Agent, or Firm* — Wolf, Greenfield & Sacks, P.C.

(57) ABSTRACT

A method of forming an insulation structure inside and on top of a first semiconductor substrate, including the steps of: a) forming a trench vertically extending in the first substrate from a first surface of the first substrate; b) filling the trench, from the first surface of the first substrate, with a polysilicon region; c) thinning the first substrate on the side of a second surface of the first substrate, opposite to the first surface, to expose the polysilicon region at the bottom of the trench; d) removing the polysilicon region from the second surface of the first substrate; and e) filling the trench, from the second surface of the first substrate, with a metal.

8 Claims, 6 Drawing Sheets

(58) Field of Classification Search
CPC . H01L 21/185; H01L 21/18; H01L 21/76898; H01L 21/768
See application file for complete search history.

(56) References Cited

U.S. PATENT DOCUMENTS

2010/0308435 A1   12/2010  Nowak et al.
2012/0142185 A1*  6/2012  Park .................. H01L 21/76898
                                                  257/E21.586
2018/0069036 A1*  3/2018  Kim .................. H01L 27/14687

FOREIGN PATENT DOCUMENTS

FR         3 103 635 A1   5/2021
WO   WO 2018/050996 A1   3/2018

* cited by examiner

INSULATION STRUCTURE FORMING METHOD

CROSS-REFERENCE TO RELATED APPLICATIONS

This application claims priority to French Patent Application 2007356, filed Jul. 10, 2020, the contents of which is incorporated herein by reference in its entirety.

TECHNICAL BACKGROUND

The present disclosure generally concerns the field of integrated circuits. It more particularly concerns the forming of electric and/or optical insulation structures in integrated circuits.

PRIOR ART

Many integrated circuits comprise insulation structures. Such structures enable to electrically and/or optically insulate from one another different elements or different regions of a same chip.

The forming of electric and/or optical insulation structures in an image sensor is here particularly considered. Such insulation structures may in particular be used to insulate from one another photosensitive area of different pixels of the image sensor, or to insulate, within a same pixel, a photosensitive area from a memory area of the pixel.

SUMMARY

There is a need to improve known insulation structure forming methods.

An embodiment overcomes all or part of the disadvantages of known insulation structure forming methods.

An embodiment provides a method of forming an insulation structure inside and on top of a first semiconductor substrate, comprising the steps of:
a) forming a trench vertically extending in the first substrate from a first surface of the first substrate;
b) filling the trench, from the first surface of the first substrate, with a polysilicon region;
c) thinning the first substrate on the side of a second surface of the first substrate, opposite to the first surface, to expose the polysilicon region at the bottom of the trench;
d) removing the polysilicon region from the second surface of the first substrate; and
e) filling the trench, from the second surface of the first substrate, with a metal.

According to an embodiment, the method further comprises, between step b) and step c), a step of bonding of the first surface of the first substrate to a surface of a second substrate.

According to an embodiment, the method further comprises, between step a) and step b), a step of forming of a first electrically-insulating layer on the lateral walls and the bottom of the trench.

According to an embodiment, the method further comprises, between step a) and the step of forming of the first electrically-insulating layer, a step of deposition of a polysilicon layer coating the lateral walls and the bottom of the trench.

According to an embodiment, the method further comprises, between step d) and step e), a step of removal of the first electrically-insulating layer from the lateral walls and the bottom of the trench.

According to an embodiment, the method further comprises between step b) and step c), a step where:
the polysilicon region is removed from across a portion of the depth of the trench;
a second electrically-insulating layer is formed on a free upper surface of the polysilicon region; and
the filling of the trench is completed.

According to an embodiment, the filling of the trench is completed with polysilicon.

According to an embodiment, the filling of the trench is completed with a metal.

According to an embodiment, said insulation structure laterally separates pixels of an image sensor or semiconductor areas of a pixel of an image sensor.

BRIEF DESCRIPTION OF THE DRAWINGS

The foregoing and other features and advantages of the present invention will be discussed in detail in the following non-limiting description of specific embodiments and implementation modes in connection with the accompanying drawings, in which.

DESCRIPTION OF THE EMBODIMENTS

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and will be detailed. In particular, the devices and applications targeted by the insulation structures are not detailed, the described embodiments and implementation modes being compatible with the usual devices and applications comprising insulation structures.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

FIGS. 1 to 6 hereabove illustrate successive steps of an example of a first implementation mode of a method of forming an insulation structure. The insulation structures formed by this method may for example correspond to peripheral insulation trenches of SPAD-type ("Single Photon Avalanche Diode") photodiodes with vertical PN junctions, for example, of the type described in patent application WO201850996 previously filed by the applicant.

Figure 1:
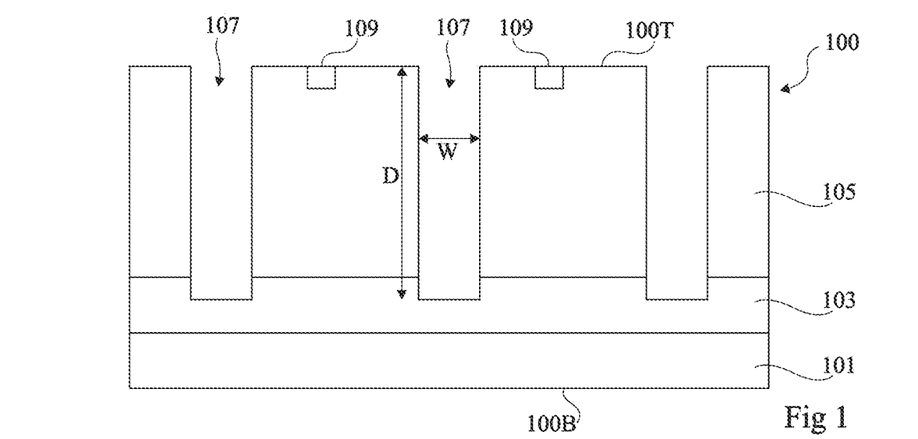
FIG. 1 is a partial simplified cross-section view illustrating a step of a first implementation mode of a method of forming an insulation structure.

FIG. 1 is a partial simplified cross-section view illustrating a step of the first implementation mode of the method of forming an insulation structure.

During this step, it is started by providing a substrate 100. Substrate 100 is for example obtained from a wafer or a piece of wafer made of a semiconductor material. In the orientation of FIG. 1, the lower and upper surfaces of substrate 100 are respectively noted 100B and 100T.

In the shown example, substrate 100 comprises a support layer 101 coated with another layer 103. Layer 103 continuously extends over the entire upper surface of support layer 101. In this example, layer 103 is coated with still another layer 105. Layer 105 continuously extends over the entire upper surface of layer 103.

Support layer 101 is a made of a semiconductor material, for example of P-type doped silicon. As an example, support layer 101 has a doping rate smaller than $5 \times 10^{14}$ atoms/cm$^3$. Layer 103 is made of a semiconductor material, for example, of N-type doped silicon. As an example, layer 103 has a doping level equal to approximately $10^{13}$ atoms/cm$^3$. Layer 105 is made of a semiconductor material, for example, of P-type doped silicon. As an example, layer 105 has a doping rate in the range from $1 \times 10^{16}$ atoms/cm$^3$ to $7 \times 10^{17}$ atoms/cm$^3$.

As an example, layer 103 has a thickness in the range from 500 nm to 2 μm. Layer 105 for example has a thickness in the range from 1 μm to 40 μm.

As an example, layer 103 is first formed by ion implantation of dopant elements in an upper portion of support layer 101, after which layer 105 is formed by epitaxy from the upper surface of layer 103.

During the step illustrated in FIG. 1, one or a plurality of trenches 107 are then formed on the side of the upper surface 100T of substrate 100. Trenches 107 extend vertically, from surface 100T, towards the lower surface 100B of substrate 100. In the shown example, trenches 107 are non-through, that is they do not emerge on the side of the lower surface 100B of substrate 100. More precisely, in this example, trenches 107 fully cross layer 105 and partially penetrate into the thickness of layer 103. As a variant, trenches 107 fully cross layer 103 and partially penetrate into the thickness of support layer 101. In top view, trenches 107 for example form a continuous gate laterally delimiting a plurality of P-type doped semiconductor islands in layer 105. Each island for example corresponds to a semiconductor anode region of a SPAD photodiode with a vertical PN junction of a pixel of an image sensor of the type described in the above-mentioned patent application WO201850996.

As an example, trenches 107 have a width W in the range from 200 nm to 2 μm, and a depth D in the range from 5 μm to 40 μm.

In the shown example, substrate 100 further comprises contacting regions 109. Contacting regions 109 are for example P-type doped with a doping level greater than that of layer 105, located in the upper portion of layer 105. As an example, each P-type island laterally delimited by trenches 107 comprises a contacting region 109 located, in top view, in a central portion of the island.

Figure 2:
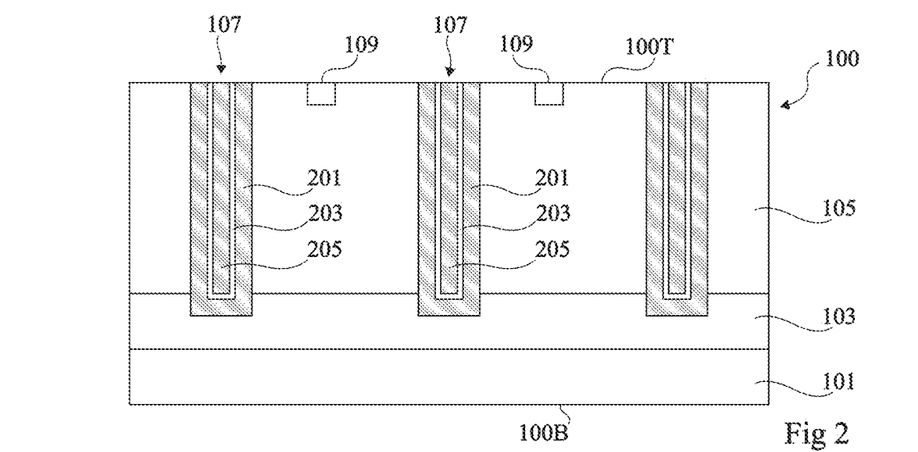
FIG. 2 is a partial simplified cross-section view illustrating another step of the first implementation mode of the method of forming an insulation structure.

FIG. 2 is a partial simplified cross-section view illustrating another step of the first implementation mode of the method of forming an insulation structure.

During this step, the inner walls of trenches 107, in other words, the lateral walls and the bottom of trenches 107, are integrally coated with a polysilicon layer 201. In this example, polysilicon layer 201 is N-type doped. As an example, layer 201 has a doping rate in the range from $10^{17}$ atoms/cm$^3$ to $10^{20}$ atoms/cm$^3$. The thickness of layer 201 covering the inner walls of each trench 107 is adjusted so that layer 201 does not totally fill trench 107. As an example, the thickness of layer 201 is in the range from 100 nm to 500 nm, for example, equal to approximately 200 nm.

Layer 201 is for example formed by chemical vapor deposition (CVD).

In the shown example, an electrically-insulating layer 203 is then formed on the lateral walls and the bottom of each trench 107. Layer 203 is for example made of silicon oxide. As a variant, layer 203 is for example made of silicon oxynitride. In the shown example, layer 203 coats layer 201 inside of each trench 107. The thickness of layer 203 is adjusted so that layer 203 does not totally fill trench 107. As an example, the thickness of layer 203 is in the range from 5 nm to 50 nm, for example, equal to approximately 20 nm.

Layer 203 is for example formed by thermal oxidation of polysilicon layer 201.

As a variant, layer 203 is for example formed by an atomic layer deposition (ALD), for example, by a plasma-enhanced atomic layer deposition (PEALD).

Trenches 107 are then filled with a polysilicon region 205. In this example, polysilicon region 205 is N-type doped. As an example, region 205 has a doping rate in the range from $10^{17}$ atoms/cm$^3$ to $10^{20}$ atoms/cm$^3$. As an example, region 205 has a width in the range from 100 nm to 200 nm, for example, equal to approximately 150 nm.

Region 205 is for example formed by chemical vapor deposition.

Figure 3:
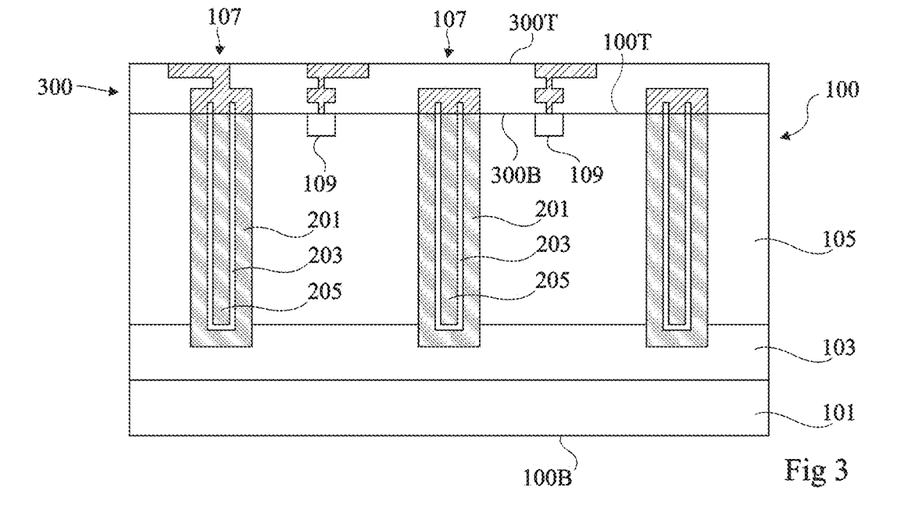
FIG. 3 is a partial simplified cross-section view illustrating still another step of the first implementation mode of the method of forming an insulation structure.

FIG. 3 is a partial simplified cross-section view illustrating still another step of the first implementation mode of the method of forming an insulation structure.

During this step, an interconnection network 300 is formed on the upper surface side 100T of substrate 100. More precisely, in the shown example, interconnection network 300 extends over the entire upper surface 100T of substrate 100. In the orientation of FIG. 3, the lower and upper surfaces of interconnection network 300 are respectively noted 300B and 300T.

As an example, interconnection network 300 is formed from a stack comprising metallization levels separated from one another by dielectric layers. Each metallization level of interconnection network 300 typically comprises a plurality of separate portions, electrically insulated from one another, of a same metal layer. In the shown example, interconnection network 300 further comprises conductive vias. These conductive vias particularly enable to interconnect a plurality of portions of metal layers forming part of different metallization levels.

Generally, interconnection network 300 ensures a function of routing of electric connections between its lower surface 300B, located opposite the upper surface 100T of substrate 100, and its upper surface 300T. In the shown example, vias of interconnection network 300 flush with surface 300B come into contact with layers 201, regions 205, and contacting areas 109 at the level of the upper surface 100T of substrate 100.

In the example illustrated in FIG. 3, in each trench 107, layer 201 and region 205 arranged in the trench are electrically connected to one another by vias and/or metallizations of interconnection network 300.

Figure 4:
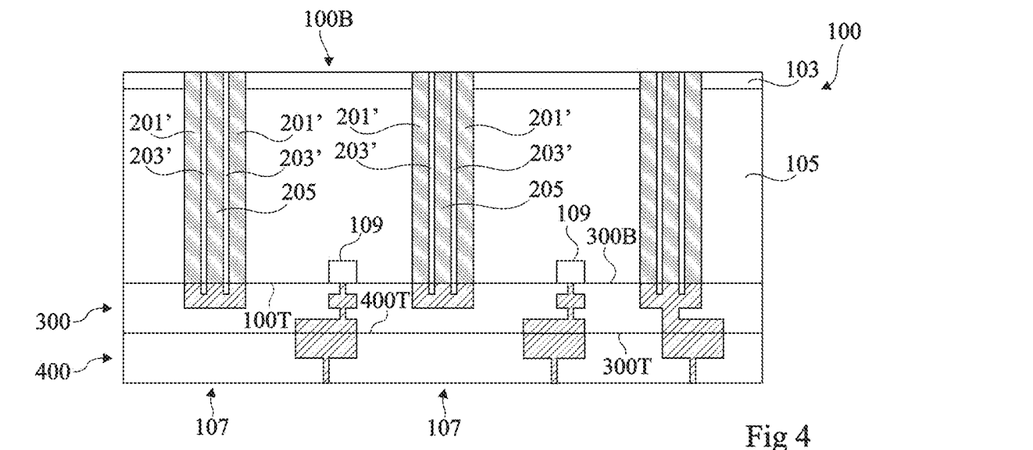
FIG. 4 is a partial simplified cross-section view illustrating still another step of the first implementation mode of the method of forming an insulation structure.

FIG. 4 is a partial simplified cross-section view illustrating still another step of the first implementation mode of the method of forming an insulation structure.

FIG. 4 more precisely illustrates a step of transfer, onto another substrate 400, of the assembly comprising substrate 100 and interconnection network 300. More particularly, in the shown example, substrate 100 is flipped with respect to the orientation of FIG. 3 and transferred onto substrate 400, so that the surface 300T of interconnection network 300 is in contact with an upper surface 400T of substrate 400. The two structures are attached to each other, for example by direct bonding or molecular bonding of the surface 300T of interconnection network 300 to the surface 400T of substrate 400.

Substrate 400 is for example obtained from a wafer or a piece of wafer made of a semiconductor material, for example, silicon. In the shown example, substrate 400 comprises contacting elements flush with its upper surface 400T. As an example, the contacting elements of substrate 400 are made of metal, for example, of copper.

In the shown example, the contacting elements of substrate 400 are located opposite metal layer portions flush with the surface 300T of interconnection network 300. On transfer of the structure obtained at the end of the step of FIG. 3 onto substrate 400, the metal layer portions flush with the surface 300T of interconnection network 300 thus contact the contacting elements flush with the surface 400T of substrate 400.

Substrate 100 is then thinned, for example, by grinding, on the side of its surface 100B. In the shown example, substrate 100 is more particularly thinned to expose region 205 at the bottom of each trench 107. The grinding of substrate 100 is for example followed by a chemical mechanical polishing (CMP) step.

In the case illustrated in FIG. 1 where trenches 107 stop across the thickness of layer 103, support layer 101, not shown in FIG. 4, is for example totally removed at the end of the step of thinning of substrate 100, while layer 103 is for example only partially removed. In other words, in this example, a portion of the thickness of layer 103 is kept on the side of surface 100B of substrate 100.

In the shown example, separate portions 201' of layer 201, separate portions 203' of layer 203 and regions 205 are flush with the upper surface of layer 103 at the end of the operation of thinning of substrate 100.

Figure 5:
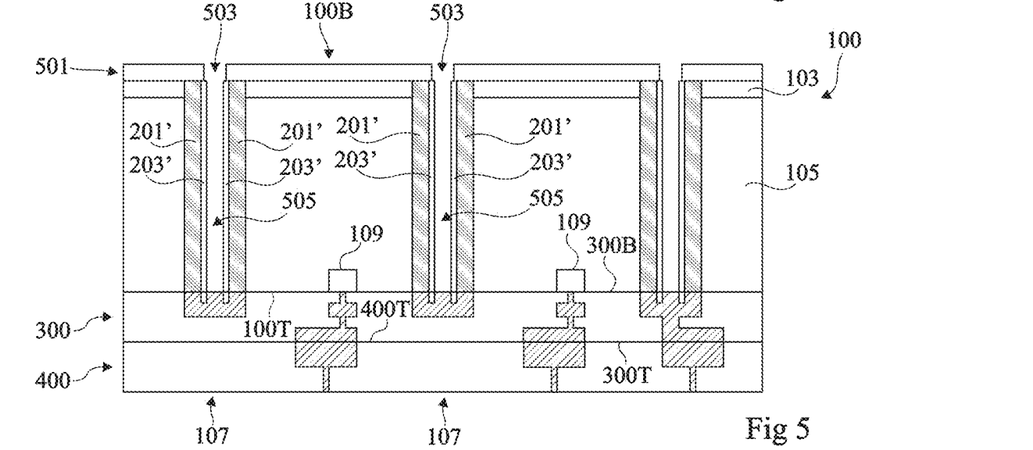
FIG. 5 is a partial simplified cross-section view illustrating still another step of the first implementation mode of the method of forming an insulation structure.

FIG. 5 is a partial simplified cross-section view illustrating still another step of the first implementation mode of the method of forming an insulation structure.

During this step, a layer 501 is deposited on the upper surface side of the structure obtained at the end of the step of FIG. 4, that is, on the side of the upper surface of layer 103. Layer 501 is for example a so-called hard mask layer, for example, made of silicon nitride or of silicon oxynitride. As an example, layer 501 has a monolayer structure. As a variant, layer 501 has a multilayer structure.

Layer 501 is for example first deposited over the entire upper surface of the structure, after which local through openings 503 are formed in layer 501, for example, by photolithography, to expose all or part of the upper surface of each region 205, without exposing portions 201' of layer 201 or the upper surface of layer 103.

The alignment of the etch mask, not shown, used to form openings 503 in line with each region 205 is for example performed by using alignment marks, not shown, which extend for example vertically from the surface 100T of substrate 100. As an example, the alignment marks are through and extend for example, through layer 105 and layer 103, down to the upper surface of layer 103 in the orientation of FIG. 5.

As a variant, the alignment marks are non-through and for example stop across the thickness of layer 105. In the case of non-through alignment marks, it may be provided to expose these alignment marks, for example, by etching from the upper surface of the structure, to ease the operation of alignment of the photolithographic etch mask with respect to substrate 100. It may as a variant be provided to form, for example, prior to the etching, other alignment marks, not show, vertically extending from the upper surface of layer 103, across the thickness of layer 103. If need be, the alignment marks are for example formed in line with the alignment marks which vertically extend from surface 100T of substrate 100.

In the shown example, regions 205 are then totally removed by etching. Regions 205 are for example removed by being exposing to a plasma. The plasma used is for example selected to etch regions 205 selectively over portions 203' of layer 203. As an example, the plasma used to remove regions 205 is a plasma based on sulfur hexafluoride.

Inside of each trench 107, the removal of sacrificial region 205 forms a recess 505. In the shown example, each recess 505 is delimited, laterally by portions 203' of layer 203 and vertically by surface 300B of interconnection network 300.

Figure 6:
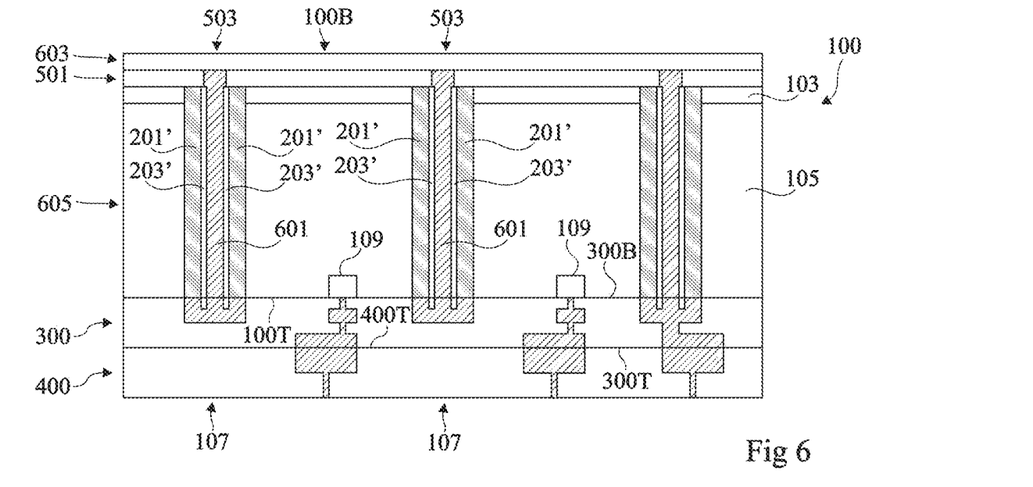
FIG. 6 is a partial simplified cross-section view illustrating still another step of the first implementation mode of the method of forming an insulation structure.

FIG. 6 is a partial simplified cross-section view illustrating still another step of the first implementation mode of the method of forming an insulation structure.

During this step, each recess 505 is filled with a metal 601 from the surface 100B of substrate 100. Trenches 107 are for example totally filled with metal 601. In the shown example, metal 601 also fills the openings 503 of layer 501, so that the metal 601 deposited inside of openings 503 is flush with the upper surface of layer 501. As an example, the metal 601 used to fill recesses 505 and openings 503 is a metal from the group comprising copper, aluminum, and tungsten, or an alloy of one or a plurality of these metals.

In the shown example, the upper surface of the structure is then coated with another layer 603. Layer 603 continuously extends over the entire upper surface of the structure. More precisely, layer 603 for example covers the upper surface of layer 501 and the metal 601 which is flush with the upper surface of layer 501. As an example, layer 603 is a passivation layer, for example, made of a dielectric material, enabling to protect metal 601 against oxidation. Layer 603 is for example made of the same material as layer 501, for example, of silicon nitride.

At the end of the steps previously described in relation with FIGS. 1 to 6, an insulation structure 605 formed inside and on top of substrate 100 is obtained. Insulation structure 605 for example ensures a function of electric insulation (insulation by PN junction) between different islands of layer 105. As an example, the portions 201' of layer 201 correspond to semiconductor cathode regions of SPAD photodiodes with vertical PN junctions of an image sensor of the type described in the above-mentioned patent application WO201850996.

Further, due to the presence of metal 601 inside of trenches 107, insulation structure 605 may ensure a function of optical insulation between areas of substrate 100, for example, by at least partially reflecting incident light rays. This optical insulation function is particularly useful in image sensors, for example, sensors of the type described in the above-mentioned patent application WO201850996, wherein it is particularly desired to avoid crosstalk phenomena between neighboring pixels of the sensor.

An advantage of the method described in relation with FIGS. 1 to 6 is that the filling of trenches 107 with metal, to form metal regions 601, is only performed after the steps of transfer of substrate 100 onto substrate 400 and of bonding of substrate 100 to substrate 400.

This particularly enables to decrease risks of contamination of substrate 100 with the metal. Indeed, during the step of bonding of substrate 100 to substrate 400, the assembly may be submitted to relatively high temperatures, which might result in a metal diffusion into substrate 100 if trenches 107 were already filled with metal at this step.

This further enables to limit the mechanical stress undergone by the assembly during the step of bonding of substrate 100 to substrate 400. Indeed, metal 601 has a thermal expansion coefficient different from the expansion coefficients of the other materials of the structure. During the bonding operation, this expansion coefficient difference is likely to cause relatively high stress, or even dislocations in the structure, which might adversely affect the operation of the formed device.

Another advantage of the first implementation mode described hereabove in relation with FIGS. 1 to 6 lies in the fact that the filling of trenches 107 with metal 601 is performed after the operation of thinning of substrate 100 illustrated in FIG. 4. This particularly enables to ease this thinning operation and to obtain a surface of better quality than that which would be obtained from a structure comprising metal 601 in trenches 107 from as soon as the step of FIG. 2.

Figure 7:
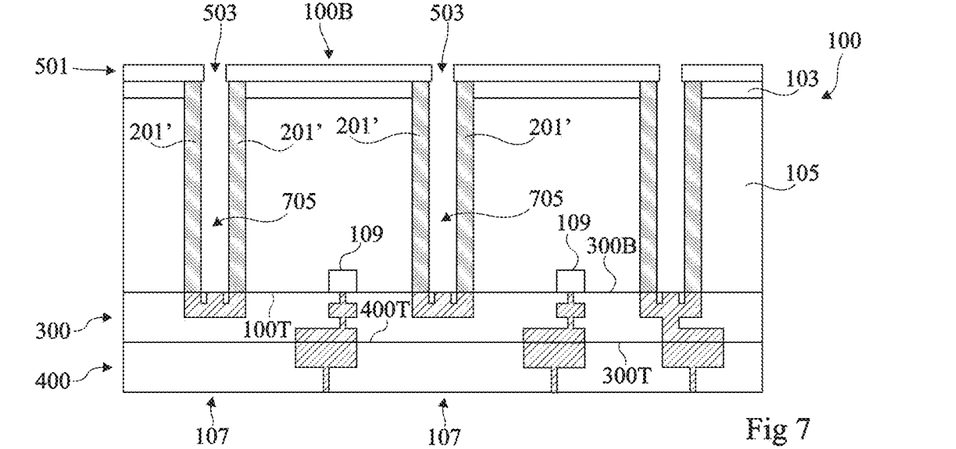
FIG. 7 is a partial simplified cross-section view illustrating a step of a variant of the first implementation mode of the method of forming an insulation structure.
Figure 8:
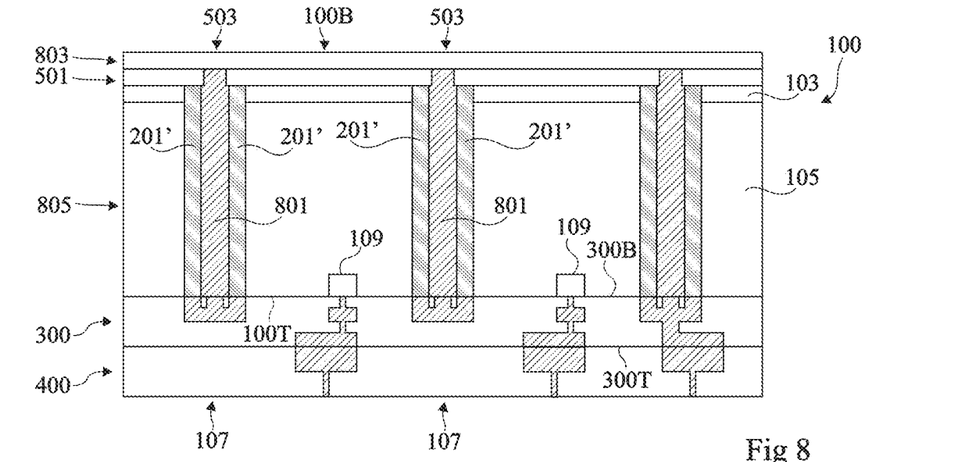
FIG. 8 is a partial simplified cross-section view illustrating another step of the variant of the first implementation mode of the method of forming an insulation structure.

FIGS. 7 and 8 hereafter illustrate successive steps of a variant of the first implementation mode of the method of forming an insulating structure previously discussed in relation with FIGS. 1 to 6.

The variant of FIGS. 7 and 8 differs from what has been previously described in relation with FIGS. 1 to 6 mainly in that, in this variant, not only regions 205, but also portions 203' of layer 203, are removed.

FIG. 7 is a partial simplified cross-section view illustrating a step of the variant of the first implementation mode of the method of forming an insulation structure.

During this step, it is for example started from a structure similar to that previously described in relation with FIG. 5. Portions 203' of layer 203 are then removed to expose portions 201' of layer 201 inside of each trench 107. In practice, the portions of layer 203 are for example removed by exposing the portions 203' of layer 203 to vapor-phase hydrofluoric acid.

The removal of the portions 203' of layer 203 results in the forming of a recess 705 inside of each trench 107. In the shown example, each recess 705 is delimited, laterally by portions 201' of layer 201 and vertically by the surface 300B of interconnection network 300.

FIG. 8 is a partial simplified cross-section view illustrating another step of the variant of the first implementation mode of the method of forming an insulation structure.

During this step, each recess 705 is filled with a metal 801 from the surface 100B of substrate 100. Trenches 107 are for example totally filled with metal 801. In the shown example, metal 801 also fills the openings 503 of layer 501, so that the metal 801 deposited inside of openings 503 is flush with the upper surface of layer 501. The metal 801 used to fill recesses 705 and openings 503 is for example identical to the metal used to fill recesses 505, as previously discussed in relation with FIG. 6.

In the shown example, the upper surface of the structure is then coated with another layer 803, for example, similar to the layer 603 of FIG. 6. More particularly, layer 803 is for example a passivation layer enabling to protect metal 801 against oxidation.

As compared with the first implementation mode described in relation with FIGS. 1 to 6, where the metal 601 filling trenches 107 is insulated from the portions 201' of layer 201 by the portions 203' of layer 203, the variant described in relation with FIGS. 7 and 8 enables to obtain an insulation structure 805 where the metal 801 filling trenches 107 is in contact with the portions 201' of layer 201.

The variant described hereabove in relation with FIGS. 7 and 8 has advantages similar to those of the first implementation mode described in relation with FIGS. 1 to 6.

FIGS. 9 to 15 hereabove illustrate successive steps of an example of a second implementation mode of a method of forming an insulation structure. The second implementation mode of FIGS. 9 to 15 differs from the first implementation mode previously described in relation with FIGS. 1 to 8 mainly in that, in the second implementation mode, the inner walls of trenches 107 are not coated with polysilicon layer 201. Trenches 107 may in this case have a smaller width than in the first implementation mode. As an example, layer 107 has a thickness in the range from 100 nm to 1 µm.

Figure 9:
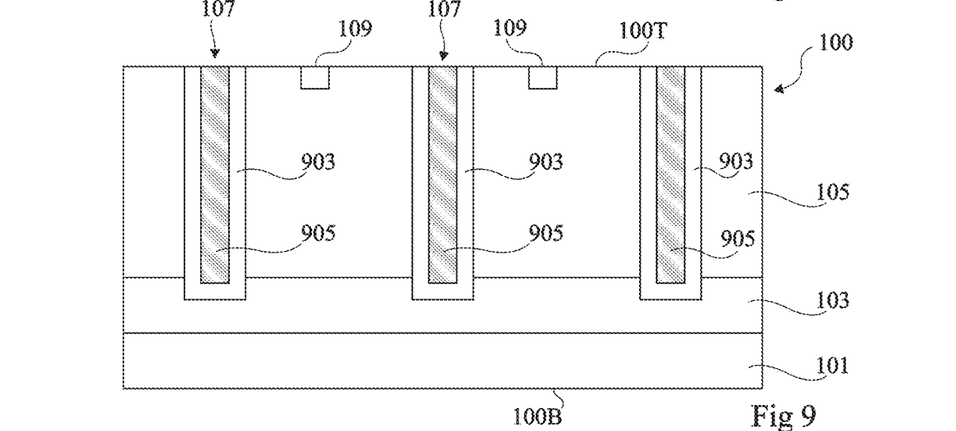
FIG. 9 is a partial simplified cross-section view illustrating a step of a second implementation mode of a method of forming an insulation structure.

FIG. 9 is a partial simplified cross-section view illustrating a step of the second implementation mode of the method of forming an insulation structure.

During this step, it is for example started from a structure similar to that previously described in relation with FIG. 1. In the shown example, an electrically-insulating layer 903 is then formed on the inner walls of trenches 107, in other words the lateral walls and the bottom of trenches 107. Layer 903 is for example made of silicon oxide. As a variation, protection layer 903 is made of silicon oxynitride. The thickness of layer 903 is adjusted so that layer 903 does not totally fill trench 107. As an example, the thickness of layer 903 is in the range from 5 nm to 50 nm, for example, equal to approximately 20 nm.

Layer 903 is for example formed by thermal oxidation of the inner walls of trench 107.

As an example, layer 903 is further formed by atomic layer deposition, for example, by plasma-enhanced atomic layer deposition. The deposition is for example performed on the thermal oxide previously formed on the inner walls of trench 107.

As a variant, layer 903 is integrally formed by an atomic layer deposition, for example, by a plasma-enhanced atomic layer deposition. The deposition is for example directly performed on the inner walls of trench 107. In this case, the thermal oxide is omitted.

Trenches 107 are then filled with a polysilicon region 905. As an example, region 905 has a width in the range from 100 nm to 900 nm, for example, equal to approximately 150 nm.

Region 905 is for example formed by chemical vapor deposition.

Figure 10:
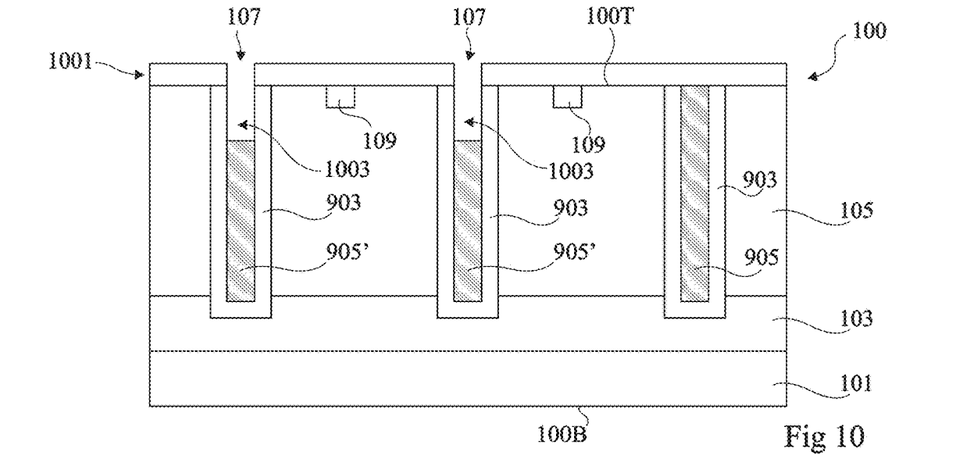
FIG. 10 is a partial simplified cross-section view illustrating another step of the second implementation mode of the method of forming an insulation structure.

FIG. 10 is a partial simplified cross-section view illustrating another step of the second implementation mode of the method of forming an insulation structure.

During this step, at least certain polysilicon regions 905 are partially removed to only keep lower portions 905' of these regions 905. In the example shown in FIG. 10, the polysilicon regions 905 located on the left-hand side and at the center of the structure are partially etched, and the region 905 located on the right-hand side of the structure is left intact.

In the shown example, a masking layer 1001, for example, made of resin, is first deposited on the upper surface side 100T of substrate 100.

During this step, local through openings are formed in layer 1001, for example, by photolithographic etching, to at least partially expose the upper surface of each region 905 which is desired to be partially removed, that is, the regions 905 located on the left-hand side and at the center of the structure in the shown example.

The alignment of the etch mask, not shown, used to locally etch layer 1001 is for example performed similarly to what has been previously described in relation with FIG. 5.

In the shown example, openings located vertically in line with the regions 905 located on the left-hand side and in the middle are thus formed in layer 1001, while the region 905 located on the right-hand side remains totally covered with layer 1001.

The exposed regions 905, that is, those which are not covered with layer 1001, are then partially removed, for example, by a selective etching of polysilicon over the oxide of layers 903. The etching of the regions 905 to be partially removed is then performed by exposure of these regions 905 to a plasma based on sulfur hexafluoride.

The thickness of the lower portions 905' of the regions 905 remaining at the end of the etching is for example controlled by adjusting the etching time, in other words, the time of exposure to the plasma of the regions 905 which are not protected by layer 1001.

Inside of each trench 107 which is not covered with layer 1001, the partial etching of the exposed region 905 results in the forming of a recess 1003 above the non-etched lower portion 905' of region 905. In the shown example, each recess 1003 is delimited, laterally by layer 903 and vertically by the portion 905' of region 905 remaining at the end of the etching.

Figure 11:
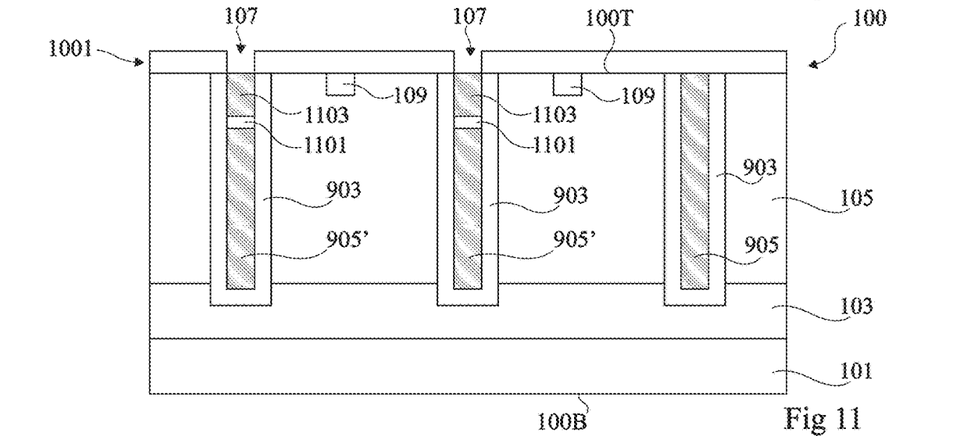
FIG. 11 is a partial simplified cross-section view illustrating still another step of the second implementation mode of the method of forming an insulation structure.

FIG. 11 is a partial simplified cross-section view illustrating still another step of the second implementation mode of the method of forming an insulation structure.

During this step, one forms, in the portions of trenches 107 which are not protected with layer 1001, an electrically-insulating layer 1101 coating the polysilicon surface left free at the end of the partial etch step of FIG. 11. As an example, layer 1101 is a silicon oxide layer. Layer 1101 is for example formed similarly to layer 903, as previously discussed in relation with FIG. 10.

The filling of the portions of trenches 107 which are not protected by layer 1001 is then completed. In the shown example, the portions of trenches 107 which are not protected by layer 1001 are filled with a region 1103. Region 1103 is for example made of polysilicon. As a variant, region 1103 may be made of metal, for example, of copper, of aluminum, of tungsten, of titanium, or of an alloy of one or a plurality of these metals.

Figure 12:
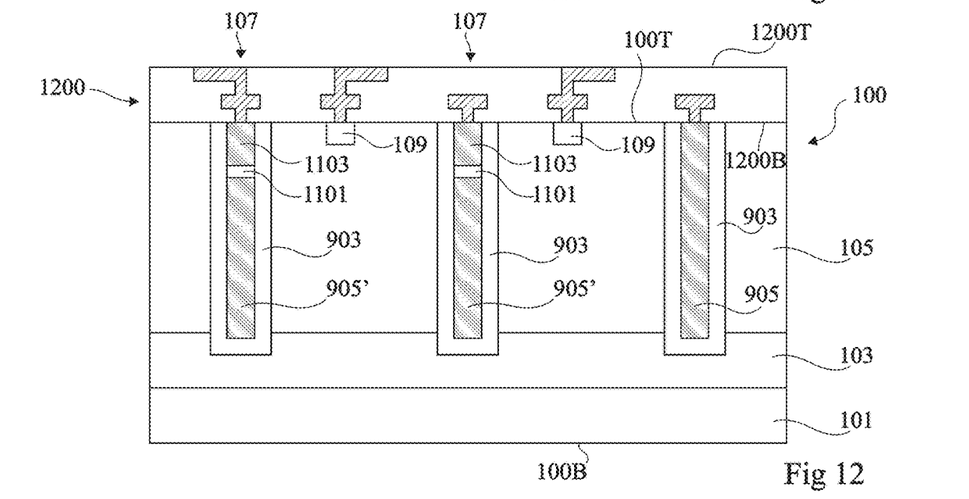
FIG. 12 is a partial simplified cross-section view illustrating still another step of the second implementation mode of the method of forming an insulation structure.

FIG. 12 is a partial simplified cross-section view illustrating still another step of the second implementation mode of the method of forming an insulation structure.

During this step, layer 1001 is removed and an interconnection network 1200 is formed on the upper surface side 100T of substrate 100. More precisely, in the shown example, interconnection network 1200 extends over the entire upper surface 100T of substrate 100. In the orientation of FIG. 12, the lower and upper surfaces of interconnection network 1200 are respectively noted 1200B and 1200T.

The interconnection network 1200 of FIG. 12 is for example similar to the interconnection network 300 previously described in relation with FIG. 3. As an example, interconnection network 1200 comprises metal layer portions and vias enabling to ensure a function of routing of electric connections between surface 1200B and surface 1200T.

In the example illustrated in FIG. 12, interconnection network 1200:
  connects the region 1103 of one of trenches 107 to a metal layer portion flush with surface 1200T; and
  connects each contacting region 109 to a metal layer portion flush with surface 1200T.

This example is however not limiting, those skilled in the art being capable of adapting interconnection network 1200 according to the targeted application.

Figure 13:
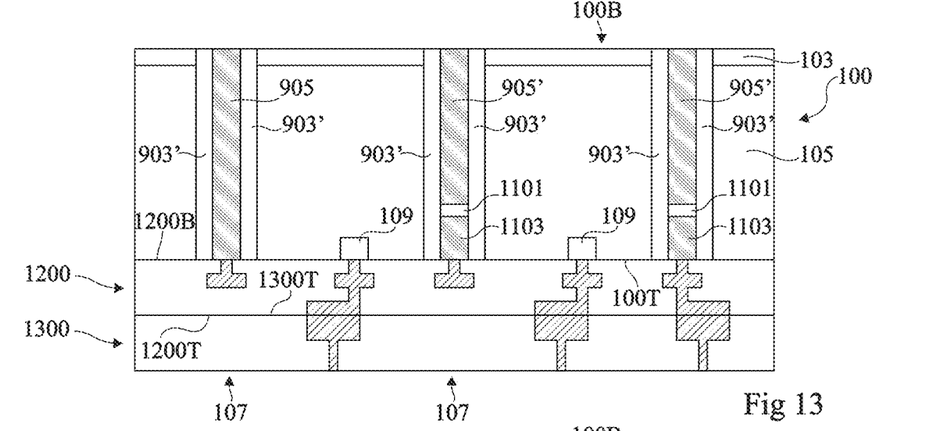
FIG. 13 is a partial simplified cross-section view illustrating still another step of the second implementation mode of the method of forming an insulation structure.

FIG. 13 is a partial simplified cross-section view illustrating still another step of the second implementation mode of the method of forming an insulation structure.

FIG. 13 more precisely illustrates a step of transfer, onto another substrate 1300, of the assembly comprising substrate 100 and interconnection network 1200. More particularly, in the shown example, substrate 100 is flipped with respect to the orientation of FIG. 12 and transferred onto substrate 130, so that the surface 1200T of interconnection network 1200 is in contact with an upper surface 1300T of substrate 1300. The two structures are attached to each other, for example, by direct bonding or molecular bonding of the surface 1200T of interconnection network 1200 to the surface 1300T of substrate 1300.

Substrate 1300 is for example similar to the substrate 400 previously described in relation with FIG. 4.

In the shown example, substrate 1300 comprises contact elements opposite the metal layer portions flush with the surface 1200T of interconnection network 1200. During the transfer of the structure obtained at the end of the step of FIG. 12 onto substrate 1300, the metal layer portions flush with the surface 1200T of interconnection network 1200 thus contact the contacting elements flush with surface 1300T of substrate 1300.

Substrate 100 is then thinned, for example, by grinding, on the side of its surface 100B. In the shown example, substrate 100 is more particularly thinned to expose region 905 and portions 905' at the bottom of trenches 107. The grinding of substrate 100 is for example followed by a chemical mechanical polishing step.

In the case where trenches 107 stop across the thickness of layer 103, support layer 101, not shown in FIG. 13, is for example totally removed at the end of the operation of thinning of substrate 100, while layer 103 is for example partially removed. Similarly to the step of FIG. 4, a portion of the thickness of layer 103 is kept on the side of surface 100B of substrate 100.

In the shown example, separate portions 903' of layer 903, region 905, and portions 905' are flush with the upper surface of layer 103.

Figure 14:
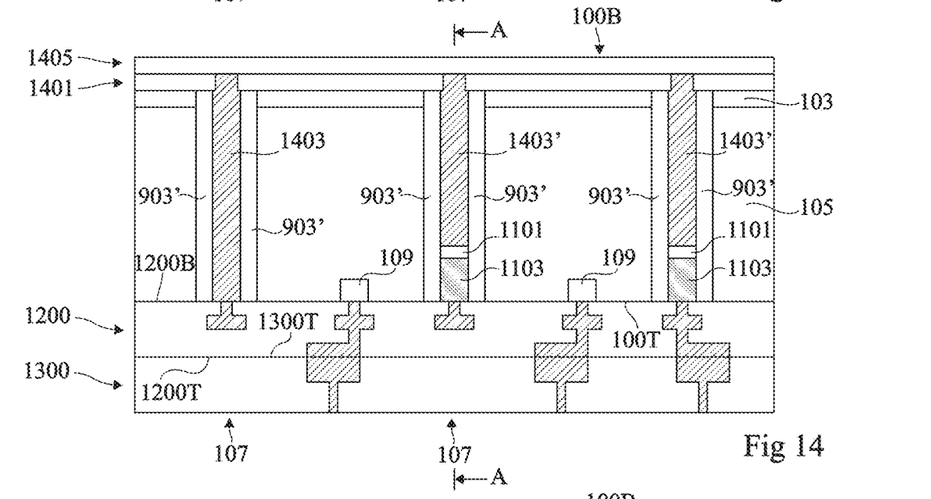
FIG. 14 is a partial simplified cross-section view illustrating still another step of the second implementation mode of the method of forming an insulation structure.

FIG. 14 is a partial simplified cross-section view illustrating still another step of the second implementation mode of the method of forming an insulation structure.

During this step, a layer 1401 is deposited on the structure on the upper surface side of layer 103. As an example, layer 1401 has a multilayer structure, comprising a so-called passivation layer, for example, made of a dielectric material, for example, of hafnium oxide, and a so-called hard mask layer, for example, made of silicon oxynitride.

During this step, layer 1401 is etched to expose all or part of the upper surfaces of regions 905 and 905'.

The operation of etching of layer 1401 is for example performed by photolithographic etching.

The alignment of the etch mask, not shown, used to locally etch layer 1401 is for example performed similarly to what has been previously described in relation with FIG. 5.

The openings made in layer 1401 for example have, in cross-section view, a width substantially equal to the width of region 905 and of portions 905'.

Similarly to what has been previously discussed in relation with FIGS. 6 and 8, region 905 and portions 905' are then removed. The removal of region 905 and of portions 905' creates recesses which are then respectively filled with metal, to obtain metal regions 1403 replacing semiconductor regions 905, and metal regions 1403' replacing semiconductor portions 905'. The metal of regions 1403 is for example identical to the metal of regions 1403'. Trenches 107 are for example integrally filled with the metal of regions 1403, 1403'. In the shown example, the metal also fills the openings of layer 1401, so that metal regions 1403, 1403' are flush with the upper surface of layer 1401. As an example, the metal of regions 1403, 1403' is identical to the metal of regions 601 of FIG. 6.

In the shown example, the upper surface of the structure is then coated with another layer 1405. Layer 1405 continuously extends over the entire upper surface of the structure. More precisely, layer 1405 for example covers the upper surface of layer 1401 and of metal regions 1403, 1403' flush with the upper surface of layer 1401. As an example, layer 1405 is a passivation layer enabling to protect metal 1403, 1403' against oxidation. Layer 1405 is for example made of a dielectric material, for example, made of silicon nitride.

Figure 15:
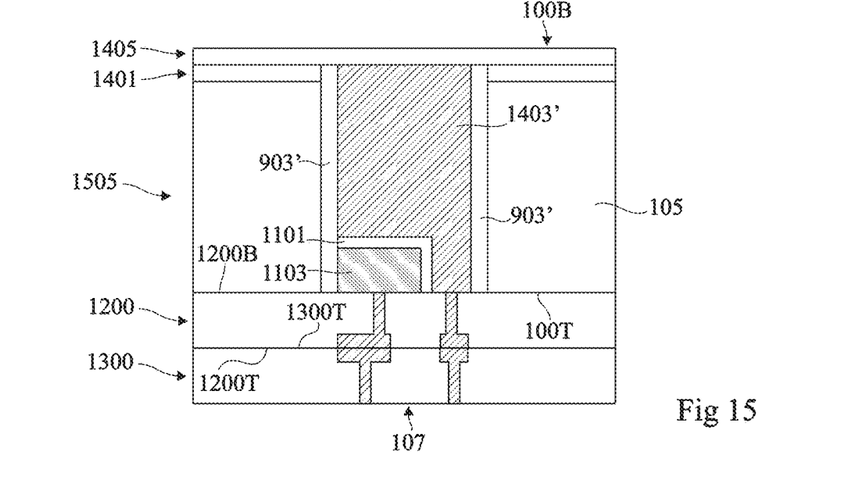
FIG. 15 is a partial simplified cross-section view along plane A-A of FIG. 14 illustrating still another step of the second implementation mode of the method of forming an insulation structure.

FIG. 15 is a partial simplified cross-section view along plane A-A of FIG. 14, illustrating still another step of the second implementation mode of the method of forming an insulation structure.

FIG. 15 more precisely illustrates a case where, at the step of FIG. 10, the region 905 located at the center of the structure has been etched so that a region of portion 905' obtained at the end of the etching is flush with the surface 100T of substrate 100. An insulation structure 1505 having certain trenches 107 comprising a region 1103 electrically insulated from metal 1403' by oxide layer 1101 is thus for example obtained. In the shown example, region 1103 and metal 1403' are contacted by different vias of interconnection network 1200. This for example enables to bias region 1103 and metal 1403' independently, which may be useful in certain applications.

The second implementation mode described hereabove in relation with FIGS. 9 to 15 has advantages similar to those of the first implementation mode described in relation with FIGS. 1 to 6. Like insulation structure 605, insulation structure 1500 may enable to ensure both electric and optical insulation functions.

An example where, during the step of FIG. 10, certain regions 905 are partially removed to form portion 905' and other regions 905 are left intact, has been described hereabove in relation with FIGS. 9 to 15. However, this example is not limiting and those skilled are particularly capable of adapting the above embodiments and implementation modes to case where any number of regions 905, or even all regions 905, are partially etched to only keep the lower portions 905' of these regions.

Further, although an example where substrate 100 comprises a doped silicon layer 103 has been described hereabove in relation with FIGS. 1 to 15, layer 103 may as a variant be omitted. The adaptation of the described embodiments and implementation modes to a case where layer 103 is omitted, for example, to a case where substrate 100 is entirely made of non-doped silicon, is within the abilities of those skilled in the art based on the above indications.

Figure 16:
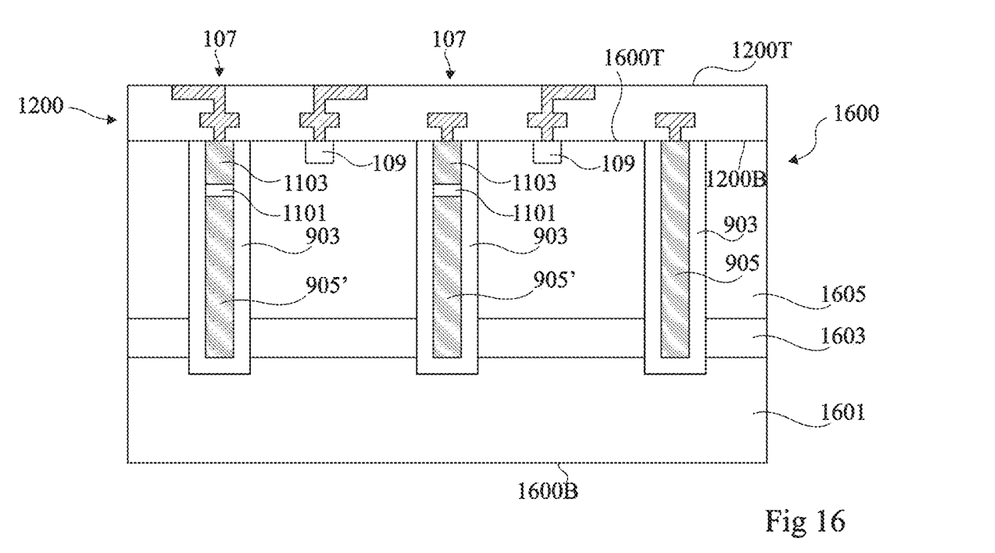
FIG. 16 is a partial simplified cross-section view illustrating a step of a variant of the second implementation mode of the method of forming an insulation structure.
Figure 17:
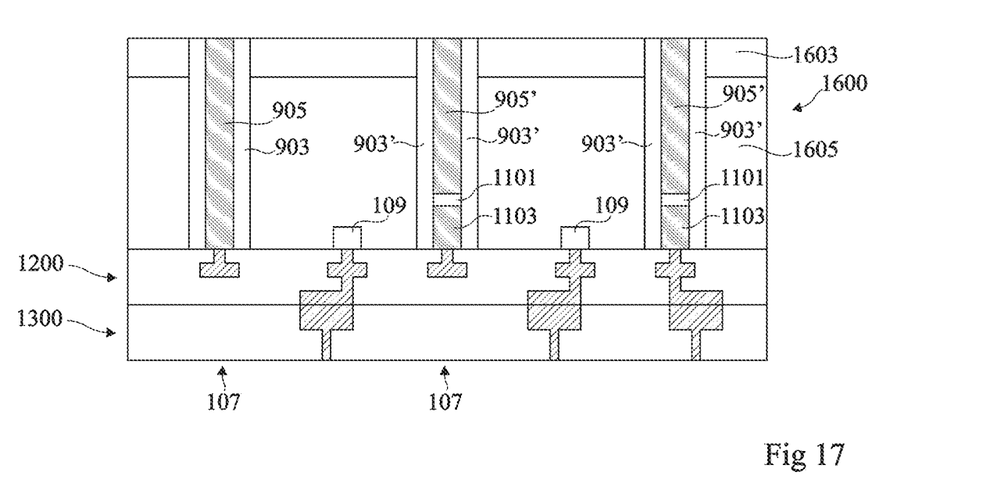
FIG. 17 is a partial simplified cross-section view illustrating another step of the variant of the second implementation mode of the method of forming an insulation structure.

FIGS. 16 and 17 illustrate successive steps of a variant of the second implementation mode of the method of forming an insulation structure previously discussed in relation with FIGS. 9 to 15.

The variant of FIGS. 16 and 17 differs from what has been previously described in relation with FIGS. 9 to 15 mainly in that, in this variant, substrate 100 is replaced with a substrate 1600 of silicon on insulator (SOI) type.

Substrate 1600 more precisely comprises a support layer 1601 coated with another layer 1603. Layer 1603 continuously extends over the entire upper surface of support layer 1601. Layer 1603 is coated with still another layer 1605, which continuously extends over the entire upper surface of layer 1603.

Layer 1601 is made of a semiconductor material, for example, silicon. Layer 1603 is made of an electrically-insulating material, for example, of silicon oxide. Layer 1605 is made of a semiconductor material, for example, of silicon.

Substrate 1600 has, at this stage, a thickness in the range from 500 µm to 1 mm, for example equal to approximately 725 µm for a wafer with a 200-mm diameter or to approximately 775 µm for a wafer with a 300-mm diameter. As an example, layer 1603 has a thickness in the range from 50 nm to 2 µm, for example, equal to 1.5 µm.

FIG. 16 is a partial simplified cross-section view illustrating a step of the variant of the second implementation mode of the method of forming an insulation structure.

The step illustrated in FIG. 16 is for example similar to the step previously described in relation with FIG. 12, with the difference that, in FIG. 16, substrate 100 is replaced with substrate 1600. In the shown example, trenches 107 extend vertically, from the upper surface 1600T of substrate 1600 towards the lower surface 1600B of substrate 1600. Trenches 107 are non-through, that is, they do not emerge onto the lower surface side 1600B of substrate 1600. More precisely, in this example, trenches 107 totally cross layers 1605 and 1603 and partially penetrate into the thickness of support layer 1601.

In the shown example, the oxide layer 903 previously formed on the inner walls of trenches 107 extends under layer 1603.

FIG. 17 is a partial simplified cross-section view illustrating another step of the variant of the second implementation mode of the method of forming an insulation structure.

The step illustrated in FIG. 17 is for example similar to the step previously described in relation with FIG. 13, with the difference that, in FIG. 17, the thinning of substrate 1600 is stopped when layer 1603 is reached, that is, after having removed the portion of layer 903 coating the bottom of trenches 107. Region 905 and portions 905' are thus exposed without having to implement the operations of deposition and structuring of layer 1401 previously described in relation with FIG. 14. In this case, layer 1603 advantageously plays a hard mask role similar to that of layer 1401.

An advantage of the variant described in relation with FIGS. 16 and 17 lies in the fact that the use of a SOI-type substrate 1600 particularly enables to do away with the alignment operation prior to the exposure of region 905 and of portions 905' at the bottom of trenches 107.

Various embodiments, implementation modes, and variants have been described. Those skilled in the art will understand that certain features of these various embodiments, implementation modes, and variants, may be combined and other variants will occur to those skilled in the art. In particular, the variant discussed in relation with FIGS. 16 and 17 may be adapted to the first implementation mode discussed in relation with FIGS. 1 to 6 and to the variant discussed in relation with FIGS. 7 and 8. Further, the second implementation mode of FIGS. 9 to 15 is transposable to the first implementation mode of FIGS. 1 to 6 and to the variant of FIGS. 7 and 8.

Further, it will be within the abilities of those skilled in the art to adapt the first implementation mode described in relation with FIGS. 1 to 6 by omitting polysilicon layer 201 to form a deep trench insulation (DTI), for example a capacitive deep trench insulation (CDTI).

Finally, the practical implementation of the described embodiments, implementation modes, and variants is within the abilities of those skilled in the art based on the functional indications given hereabove. In particular, those skilled in the art are capable of taking advantage of the described embodiments and implementation modes in any type of device where an electric and/or optical insulation is desired.

The invention claimed is:

1. Method of forming an insulation structure inside and on top of a first semiconductor substrate, comprising the steps of:
   a) forming a trench vertically extending in the first substrate from a first surface of the first substrate;
   b) filling the trench, from the first surface of the first substrate, with a polysilicon region;
   c) thinning the first substrate on the side of a second surface of the first substrate, opposite to the first surface, to expose the polysilicon region at the bottom of the trench;
   d) removing the polysilicon region from the second surface of the first substrate; and
   e) filling the trench, from the second surface of the first substrate, with a metal the method further comprising:
   between step a) and step b), a step of forming of a first electrically-insulating layer on the lateral walls and the bottom of the trench; and
   between step a) and the step of forming of the first electrically-insulating layer, a step of deposition of a polysilicon layer coating the lateral walls and the bottom of the trench.

2. Method according to claim 1, further comprising, between step b) and step c), a step of bonding of the first surface of the first substrate to a surface of a second substrate.

3. Method according to claim 1, further comprising, between step d) and step e), a step of removal of the first electrically-insulating layer from the lateral walls and the bottom of the trench.

4. Method according to claim 1, wherein said insulation structure laterally separates pixels of an image sensor or semiconductor areas of an image sensor pixel.

5. Method of forming an insulation structure inside and on top of a first semiconductor substrate, comprising the steps of:
   a) forming a trench vertically extending in the first substrate from a first surface of the first substrate;
   b) filling the trench, from the first surface of the first substrate, with a polysilicon region;
   c) thinning the first substrate on the side of a second surface of the first substrate, opposite to the first surface, to expose the polysilicon region at the bottom of the trench;
   d) removing the polysilicon region from the second surface of the first substrate; and
   e) filling the trench, from the second surface of the first substrate, with a metal, the method further comprising, between step b) and step c), a step where:
   the polysilicon region is removed from across a portion of the depth of the trench;
   a second electrically-insulating layer is formed on a free upper surface of the poly silicon region; and
   the filling of the trench is completed.

6. Method according to claim 5, wherein the filling of the trench is completed with polysilicon.

7. Method according to claim 5, wherein the filling of the trench is completed with a metal.

8. Method according to claim 5, wherein said insulation structure laterally separates pixels of an image sensor or semiconductor areas of an image sensor pixel.

* * * * *